United States Patent
Bayram et al.

(10) Patent No.: US 9,058,990 B1
(45) Date of Patent: Jun. 16, 2015

(54) CONTROLLED SPALLING OF GROUP III NITRIDES CONTAINING AN EMBEDDED SPALL RELEASING PLANE

(71) Applicant: International Business Machines Corporation, Armonk, NY (US)

(72) Inventors: Can Bayram, Ossining, NY (US); Stephen W. Bedell, Wappingers Falls, NY (US); Keith E. Fogel, Hopewell Junction, NY (US); John A. Ott, Greenwood Lake, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/134,621

(22) Filed: Dec. 19, 2013

(51) Int. Cl.
  *H01L 21/02* (2006.01)
  *H01L 21/76* (2006.01)
  *H01L 21/762* (2006.01)

(52) U.S. Cl.
  CPC ........ *H01L 21/0254* (2013.01); *H01L 21/0262* (2013.01); *H01L 21/76254* (2013.01)

(58) Field of Classification Search
  USPC .......... 438/149–166, 295, 311, 404–413, 438/458–459, 479–481, 967, 46, 47, 77, 84, 438/93–95, 102, 104, 188, 189, 285, 438/603–604, 606, 930–933
  See application file for complete search history.

(56) References Cited

U.S. PATENT DOCUMENTS

| | | | |
|---|---|---|---|
| 7,232,737 B2 | 6/2007 | Daval | |
| 7,732,301 B1 | 6/2010 | Pinnington et al. | |
| 8,003,491 B2 | 8/2011 | Cherekdjian et al. | |
| 8,338,269 B2 | 12/2012 | Cherekdjian et al. | |
| 8,530,337 B1 * | 9/2013 | Bedell et al. | 438/459 |
| 2010/0311250 A1 | 12/2010 | Bedell et al. | |

(Continued)

FOREIGN PATENT DOCUMENTS

| | | |
|---|---|---|
| JP | 10341037 | 12/1998 |
| WO | WO2010011842 A2 | 1/2010 |

OTHER PUBLICATIONS

Terao, S., et al., "Fracture of AlxGa1-xN/GaN Heterostructure—Compositional and Impurity Dependence—", Jpn. J. Appl. Phys., Mar. 1, 2001, pp. L195-L197, vol. 40, Part 2, No. 3A.

(Continued)

*Primary Examiner* — Mamadou Diallo
(74) *Attorney, Agent, or Firm* — Scully, Scott, Murphy & Presser, P.C.; Louis J. Percello, Esq.

(57) ABSTRACT

A spall releasing plane is formed embedded within a Group III nitride material layer. The spall releasing plane includes a material that has a different strain, a different structure and a different composition compared with the Group III nitride material portions that provide the Group III nitride material layer and embed the spall releasing plane. The spall releasing plane provides a weakened material plane region within the Group III nitride material layer which during a subsequently performed spalling process can be used to release one of the portions of Group III nitride material from the original Group III nitride material layer. In particular, during the spalling process crack initiation and propagation occurs within the spall releasing plane embedded within the original Group III nitride material layer.

19 Claims, 4 Drawing Sheets

(56) References Cited

U.S. PATENT DOCUMENTS

| | | | |
|---|---|---|---|
| 2012/0028443 | A1 | 2/2012 | Cherekdjian et al. |
| 2012/0318334 | A1* | 12/2012 | Bedell et al. .......... 136/255 |
| 2012/0322244 | A1* | 12/2012 | Bedell et al. .......... 438/478 |
| 2013/0011656 | A1 | 1/2013 | Zhang et al. |
| 2013/0220408 | A1* | 8/2013 | Bedell et al. .......... 136/255 |
| 2013/0260505 | A1* | 10/2013 | Bedell et al. .......... 438/67 |
| 2013/0269860 | A1* | 10/2013 | Khayyat et al. .......... 156/163 |

OTHER PUBLICATIONS

Clos, R., et al., "Wafer curvature in the nonlinear deformation range", Phys. Stat. Sol. (a), published online Aug. 23, 2004, pp. R75-R78, 201, No. 11.

Bayram, C., et al., "Delta-doping optimization for high quality p-type GaN", Journal of Applied Physics, published online Oct. 22, 2008, 104, pp. 083512-1 to 083512-5.

Bayram, C., et al., "Performance enhancement of GaN ultraviolet avalanche photodiodes with p-type d-doping", Applied Physics Letters, published online Jun. 17, 2008, 92, pp. 241103-1 to 241103-3.

Thornton, J.A., "Internal stresses in titanium, nickel, molybedenum, and tantalum films deposited by cylindrical magnetron sputtering", J. Vac. Sci. Technol., Jan./Feb. 1977, vol. 14, No. 1.

* cited by examiner

CONTROLLED SPALLING OF GROUP III NITRIDES CONTAINING AN EMBEDDED SPALL RELEASING PLANE

BACKGROUND

The present application relates to a method of forming a Group III nitride containing semiconductor structure. More particularly, the present application relates to a method of removing, i.e., releasing, a portion of a Group III nitride material from a multilayered stack containing a Group III nitride material layer by spalling.

Group III nitride materials are a unique group of semiconductor materials which can be used in a wide variety of applications including, for example, optoelectronics, photovoltaics and lighting. Group III nitride materials are composed of nitrogen and at least one element from Group III, i.e., aluminum (Al), gallium (Ga) and indium (In), of the Periodic Table of Elements. Illustrative examples of some common gallium nitrides are GaN, GaAlN, and GaAlInN. By changing the composition of Al, Ga and/or In within a Group III nitride material, the Group III nitride material can be tuned along the electromagnetic spectrum; mainly from 210 nm to 1770 nm. This spectrum includes the visible light emitting diode (LED), which is more than a 10 billion dollar industry with a forecasted double digit yearly growth rate. This continuous growth in LED demand enables the infrastructural build-up for the growth and fabrication of Group III nitride based semiconductor devices.

One of the bottlenecks for Group III nitride based semiconductor devices is a lack of a latticed matched substrate. Some of the conventional substrates are sapphire ($Al_2O_3$), silicon carbide (SiC), silicon (Si), and zinc oxide (ZnO) that have about 13%, 3%, 17% and 2%, respectively, lattice mismatch with GaN. Currently, lattice matched freestanding GaN and AlN substrates are being developed. However, lattice matched substrates suffer from availability and cost.

Despite all the research efforts, the cost of Group III nitride containing devices is high. One way to reduce the cost is to enable reuse of the Group III nitride material.

Substrate release in Group III nitrides is currently being realized by a technique called laser-liftoff. Laser lift-off employs a high power focused laser beam to target the Group III nitride/substrate interface to melt the Group III nitride into the corresponding Group IIII element. After this laser treatment, and once heated up-to about 100° C., the Group IIII element melts releasing the substrate. This approach is slow, applies to only small areas, and requires a substrate where the laser can penetrate through without absorption so that it can be absorbed at the Group III nitride material/substrate interface. For instance, this technique cannot be employed for GaN or ZnO substrates, silicon, or silicon carbide as these materials have an optical bandgap that is close to, or smaller than, GaN material. In addition, the laser lift-off approach leads to the formation of a Group III element on the point of laser contact that degrades the substrate reusage. Further, the laser-lift approach can damage the laser exposed Group III nitride material layer.

In view of the above, a substrate release technique for a Group III nitride material system is needed to cut down costs of Group III nitride based semiconductor devices. Such a technique should (1) be applicable to large diameter wafers, (2) be industrial, convenient, and fast to execute, and (3) not damage the released epilayers or the underlying substrate.

SUMMARY

A spall releasing plane is formed embedded within a Group III nitride material layer. The spall releasing plane includes a material that has a different strain, a different structure and a different composition compared with the Group III nitride material portions (i.e., lower and upper) that provide the Group III nitride material layer and embed the spall releasing plane. The spall releasing plane provides a weakened material plane region within the Group III nitride material layer which during a subsequently performed spalling process can be used to release one of the portions of Group III nitride material from the original Group III nitride material layer. In particular, during the spalling process crack initiation and propagation occurs within the spall releasing plane embedded within the original Group III nitride material layer. Thus, the present application provides a means to control the depth of spalling within a Group III nitride material layer.

In one aspect of the present application, a method for removing a portion of a Group III nitride material from a Group III nitride material layer is provided. The method of the present application includes forming a Group III nitride material layer on a surface of a substrate. In accordance with the present application, the Group III nitride material layer includes a spall releasing plane containing at least one type of impurity atom embedded within the Group III nitride material layer. The Group III nitride material layer is formed by first growing a lower portion of the Group III nitride material layer on the substrate, second growing the spall releasing plane, and third growing an upper portion of the Group III nitride material layer on the spall releasing plane. After forming the Group II nitride material layer, a semiconductor device layer is formed on the upper portion of the Group III nitride material layer. Next, a stressor layer is formed atop an uppermost surface of the semiconductor device layer. After forming the stressor layer, the upper portion of the Group III nitride material layer and the semiconductor device layer are removed by spalling to provide a spalled structure comprising the stressor layer, the semiconductor device layer and the upper portion of the Group III nitride material layer.

DETAILED DESCRIPTION

Figure 1:
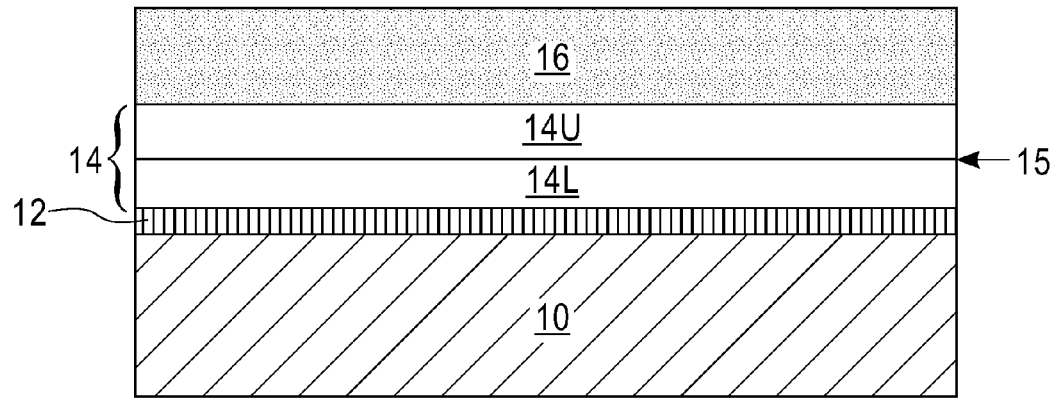
FIG. 1 is a cross sectional view of a multilayered stack of, from bottom to top, a substrate, a Group III nitride material layer containing a spall releasing plane embedded therein, and a semiconductor device layer that can be employed in accordance with the present application.

The present application will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Devices such as, for example, photovoltaic and electrooptical, which can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be reused, additional fabrication cost reduction can be achieved.

Efforts to (i) create thin-film substrates from bulk materials (i.e., semiconductors) and (ii) form thin-film device layers by removing device layers from the underlying bulk substrates on which they were formed are ongoing. The recent development, see, for example, U.S. Patent Application Publication No. 2010/0311250 A1 to Bedell et al., of a novel layer transfer method referred to as 'controlled spalling technology' has permitted the fabrication of low-cost, thin-film, high quality substrates by removing a surface layer from a base substrate. Spalling is a process where a strain material such as nickel (Ni) is deposited on top of a base substrate leading to a tensile strain enabling the release of a material layer from the base substrate through fracture mode control. The thin-film substrate layers that can be removed by this controlled spalling technology can be used to 1) increase the cost per Watt value of conventional photovoltaic technology or 2) permit fabrication of novel, high-efficiency photovoltaic, electronic and opto-electronic materials that are flexible and can be used to produce new products.

Despite the above, Group III nitride materials are more harder and robust materials than other semiconductors such as silicon, germanium, and gallium arsenide; thus, controlling the mode of fracture is essential. The present application provides a spalling method which has been specifically designed for controlling the mode of fracture within a Group III nitride material though modification of the mechanical and/or structures properties of a Group III nitride material layer.

Referring first to FIG. 1, there is illustrated a multilayered stack of, from bottom to top, a substrate 10, a Group III nitride material layer 14, and a semiconductor device layer 16 that can be employed in accordance with the present application. As shown, the Group III nitride material layer 14 contains a spall releasing plane 15 embedded between the uppermost surface and the bottommost surface of the Group III nitride material layer 14. Notably, the spall releasing plane 15 is located between a lower portion 14L of the Group III nitride layer 14 and an upper portion 14U of the Group III nitride material layer 14. As is also shown, an optional buffer layer 12 can be located between the substrate 10 and the Group III nitride material layer 14.

The substrate 10 that can be employed in the present application includes any material in which a Group III nitride material can be subsequently grown thereon by metalorganic chemical vapor (MOCVD). As such, substrate 10 may also be referred to herein as a Group III nitride growth substrate. In some embodiments of the present application, the substrate 10 can comprise a single material having unitary construction. In another embodiment of the present application, the substrate 10 can comprise two or more different materials stacked one atop the other.

In one embodiment of the present application, substrate 10 can comprise a semiconductor material including for example, (111) silicon, silicon carbide, a Group III nitride material, or a multilayered stack thereof. For example, substrate 10 can comprise a multilayered stack of, from bottom to top, a layer of silicon and an epitaxially grown Group III nitride. The term "Group III nitride" as used throughout the present application denotes a compound of nitrogen and at least one element from Group III, i.e., aluminum (Al), gallium (Ga) and indium (In), of the Periodic Table of Elements. Illustrative examples of some Group III nitride materials that can be employed as substrate 10 include, but are not limited to, GaN, AlN, AlGaN, GaAlN, and GaAlInN. In another embodiment of the present application, substrate 10 can comprise sapphire, i.e., $Al_2O_3$.

When substrate 10 is comprised of a semiconductor material, the semiconductor material that can be employed in the present application is typically a single crystalline material and may be doped, undoped or contain regions that are doped and other regions that are non-doped. The dopant may be an n-type dopant or a p-type dopant. The term "p-type" refers to the addition of impurities to an intrinsic semiconductor that creates deficiencies of valence electrons. The term "n-type" refers to the addition of impurities that contributes free electrons to an intrinsic semiconductor material. The substrate 10 may contain one region that is doped with a p-type dopant and another region that is doped with an n-type dopant.

The substrate 10 can have a thickness from 5 microns to 2 cm. Thicknesses that are greater than or lesser than the aforementioned thickness range can also be used for the substrate 10.

In some embodiments of the present application, particularly when the substrate 10 includes (111) Si, the substrate 10 may be heated in a hydrogen (or inert) atmosphere and then a prealuminization process can be performed which stabilizes the surfaces of the silicon substrate. In some embodiments of the present application, the prealuminization process is omitted. These steps are performed prior to forming an optional buffer layer 12, and prior to forming the Group III nitride material layer 14.

The heating of the substrate 10 in a hydrogen atmosphere includes placing the structure into a reactor chamber of a metalorganic chemical vapor deposition (MOCVD) apparatus. MOCVD can be performed with or without a plasma enhancement provision. In some embodiments, and prior to placing the substrate 10 into the MOCVD reactor chamber, the substrate 10 can be cleaned using an HF cleaning process. The MOCVD reactor chamber including the substrate 10 is then evacuated to a pressure of about 50-100 mbar or less and then a hydrogen atmosphere is introduced into the reactor chamber. In some embodiments, the pressure within the MOCVD reactor is at atmospheric, i.e., 760 mbar. The hydrogen atmosphere may include pure hydrogen or hydrogen admixed with an inert carrier gas such as, for example, helium and/or argon. When an admixture is employed, hydrogen comprises at least 25% or greater of the admixture, the remainder of the admixture (up to 100%) is comprised of the inert carrier gas.

With the hydrogen atmosphere present in the reactor chamber, the structure is heated to a temperature of about 900° C. or less. In one embodiment, the temperature in which substrate 10 is heated under the hydrogen atmosphere is from 500° C. to 600° C. In another embodiment, the temperature in which the substrate 10 is heated under the hydrogen atmosphere is from 600° C. to 900° C. Notwithstanding the temperature in which the substrate 10 is heated under the hydrogen atmosphere, the heating is performed for a time period of 5 minutes to 20 minutes. This step of the present application is believed to clean the surfaces and hydrogenate the exposed surfaces of the substrate 10, which may be particularly useful when a (111) silicon substrate is employed. In some embodiments, the heating under hydrogen can be replaced with heating under an inert gas.

Since most Group III elements will react directly with silicon, a prealuminization step is typically performed to stabilize the silicon nucleation sites prior to forming the Group III nitride material; no Al layer is formed during this step of the present application. The prealuminization step can be performed by introducing an organoaluminum precursor such as, for example, a trialkylaluminum compound, wherein the alkyl contains from 1 to 6 carbon atoms, into the reactor chamber. Examples of trialkylaluminum compounds that can be employed in the present application, include, but are not limited to, trimethylaluminum, triethylaluminum, and tributylaluminum. The organoaluminum precursor can be introduced in the reactor chamber of the MOCVD apparatus neat, or it can be admixed with an inert carrier gas. The prealuminization step is typically performed at a temperature of 450° C. or greater. In one embodiment, the introducing of the organoaluminum precursor typically occurs at a temperature from 500° C. to 600° C. In another embodiment, the introduction of the organoaluminum precursor occurs at a temperature from 600° C. to 900° C. Notwithstanding the temperature in which the organoaluminum precursor is introduced into the reactor chamber, the prealuminization is performed for a time period of 5 seconds to 120 seconds.

Next, buffer layer 12 can be optionally formed on an exposed surface of the substrate 10. As shown, the buffer layer 12 is a contiguous layer that is present on an entirety of the surface of substrate 10. In some embodiments, especially, when gallium nitride itself is used as the substrate 10, the step of buffer layer 12 formation can be eliminated.

The buffer layer 12 that can be formed at this point of the present application is any Group III nitride material which varies depending on the type of substrate 10 material in which the Group III nitride material layer 14 will be subsequently formed. For example, and when the substrate 10 is composed of silicon, buffer layer 12 is typically comprised of AlN. When the substrate 10 is comprised of either sapphire or SiC, buffer layer 12 can be comprised of AlN, GaN, or AlGaN. When the substrate 10 is comprised of GaN, no buffer layer 12 need be employed.

Buffer layer 12 is formed by introducing an organo-Group III element containing precursor such as, for example, an organoaluminum precursor (i.e., a trialkylaluminum compound as mentioned above) or an organogallium precursor (i.e., a trialkylgallium compound) or a mixture thereof, and a nitride precursor such as, for example, ammonium nitride into the reactor chamber of the MOCVD apparatus. MOCVD may be carried out with or without a plasma enhancement provision. An inert carrier gas may be present with one of the precursors used in forming the buffer layer 12, or an inert carrier gas can be present with both the precursors used in forming the buffer layer 12. The buffer layer 12 is typically formed at a temperature of 500° C. or greater. In one embodiment, the deposition of the buffer layer 12 typically occurs at a temperature from 650° C. to 850° C. In another embodiment, the deposition of the buffer layer 12 typically occurs at a temperature from 850° C. to 1050° C. Notwithstanding the temperature in which the buffer layer 12 is formed, the deposition of the buffer layer 12 is performed for a time period of 1 minute to 20 minutes. The buffer layer 12 that is formed typically has a thickness from 10 nm to 250 nm, with a thickness from 60 nm to 80 nm being even more typical.

Next, the Group III nitride material layer 14 including the spall releasing plane 15 containing at least one type of impurity atom is formed. As shown, the spall releasing plane 15 is located between an upper portion 14U and a lower portion 14L of the Group III nitride material layer 14.

As stated previously, the term "Group III nitride material" denotes a compound that is composed of nitrogen and at least one element from Group III, i.e., aluminum (Al), gallium (Ga) and indium (In), of the Periodic Table of Elements. Illustrative examples of some common Group III nitrides are AlN, InN, GaN, GaAlN, and GaAlInN. In one embodiment of the present application, the Group III nitride material that is formed in the present application is a gallium nitride material such as gallium nitride (GaN), GaAlN, GaInN, and GaAlInN. In another embodiment of the present application, the Group III nitride material that is formed in the present application is an aluminum nitride material such as aluminum nitride (AlN), AlGaN, AlInN, and AlGaInN. Notwithstanding the composition of the Group III nitride material layer 14, the Group III nitride material layer 14 is single crystal.

The Group III nitride material layer 14 has a fracture toughness that is less than that of the stressor material to be subsequently formed. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

The formation of the Group III nitride material layer 14 of the present application includes introducing at least one organo-Group III element containing precursor and a nitride precursor such as, for example, ammonium nitride, into the reactor chamber of the MOCVD apparatus. MOCVD may be carried out with or without a plasma enhancement provision. Examples of organogallium precursors that can be employed in the present application include trialkylgallium compounds such as, for example, trimethylgallium and triethlygallium. Examples of organoaluminum precursors that can be employed in the present application include trialkylaluminum compounds such as, for example, trimethylaluminum and triethlyaluminum. Similar precursors can be used for other types of Group III nitrides.

An inert carrier gas may be present with one of the precursors used in forming the Group III nitride material layer 14, or an inert carrier gas can be present with both the precursors used in forming the Group III nitride material layer 14.

The deposition of the Group III nitride material layer 14 is typically performed at a temperature of 750° C. or greater. In one embodiment, the deposition of the Group III nitride material layer 14 typically occurs at a temperature from 900° C. to 1200° C. In another embodiment, the deposition of the Group III nitride material layer 14 typically occurs at a temperature from 1200° C. to 1400° C. Notwithstanding the temperature in which the Group III nitride material layer 14 is formed, the deposition of the Group III nitride material layer 14 is performed for a time period of 1 minute to 2 hours.

The resultant Group III nitride material layer 14 including the spall releasing plane 15 that is formed has a thickness that is typically from 100 nm to 5000 nm, with a thickness from 500 nm to 1000 nm being even more typical.

As mentioned above, the Group III nitride material layer 14 includes a spall releasing plane 15 embedded between an upper portion 14U and a lower portion 14L of the Group III nitride material layer 14. The spall releasing plane 15 of the present application includes a material that has a different strain, a different structure and a different composition compared with the Group III nitride material that surrounds the spall releasing plane 15. The spall releasing plane 15 provides a weakened material plane region within the Group III nitride material layer 14 which during a subsequently performed spalling process can be used to release the upper portion 14U of Group III nitride material from the original Group III nitride material layer 14. In particular, during the spalling process crack initiation and propagation occurs within the spall releasing plane 15 embedded within the original Group III nitride material layer 14. Notably, the spall releasing plane has a lower fracture toughness than a fracture toughness of the lower and upper portions of the Group III nitride material layer 14.

Strain difference between the spall releasing plane 15 and the surrounding Group III nitride material portions 14U, 14L that provides the Group III nitride material layer 14 forms due to difference in the lattice constants of the spall releasing plane 15 and the neighboring portions of the Group III nitride material layer 14. Structural difference forms due to change in crystallography, and grain size, dimension and spread. Composition difference forms due to additions of other elements outside the Group III nitride material family (called impurities such as silicon (Si), magnesium (Mg), beryllium (Be), calcium (Ca), and carbon (C)).

In accordance with an embodiment of the present application, the spall releasing plane 15 is formed in-situ during growth of the Group III nitride material layer 14 on substrate 10. By "in-situ" it is meant that the spall inducing plane 15 is formed within a same reactor as the Group III nitride material layer 14 and without breaking vacuum between the various depositions. For example, a MOCVD reactor as described above can be used in forming the spall releasing plane 15 within the Group III nitride material providing the Group III nitride material layer 14. Notably, the lower portion 14L of the Group III nitride material layer 14 is grown first, followed by growing the spall inducing plane 15, and thereafter growing the upper portion 14U of the Group III nitride material layer 14.

In one embodiment of the present application, the spall releasing plane 15 includes a nitride material that includes an impurity selected from silicon, magnesium beryllium, calcium and/or carbon. An optional Group III element can also be present in the spall releasing plane 15. In one embodiment, the amount of impurity that is present in the spall releasing plane 15 is typically from $10^{20}$ atoms/cm³ to $10^{21}$ atoms/cm³. In another embodiment, the amount of impurity that is present in the spall releasing plane 15 is typically from $10^{21}$ atoms/cm³ to $10^{22}$ atoms/cm³. In one example, the Group III nitride material layer 14 may comprise a lower portion 14L of GaN, and an upper portion 14U of GaN, while the spall releasing plane 15 may comprise GaN doped with silicon, magnesium, beryllium, calcium or carbon. In another example, the Group III nitride material layer 14 may comprise a lower portion 14L of GaN, and an upper portion of 14U GaN, while the spall releasing plane 15 may comprise InAlN doped with silicon, magnesium, beryllium, calcium or carbon.

As stated above, and in one embodiment of the present application, the impurity can be introduced into the reactor in the absence of any Group III precursor material. Such a process can be referred to as a delta-doping scheme. This provides a means for incorporating the impurities on the surface of a Group III nitride material. In some embodiments, the impurities can lower the fracture toughness of the Group III nitride material containing the same.

Notwithstanding the type of spall releasing plane 15 that is employed, the spall releasing plane 15 that is embedded in the Group III nitride material layer 14 may have a thickness from 10 nm to 500 nm. Other thicknesses that are lesser than or greater than the aforementioned thickness range can also be employed as the spall releasing plane 15. In some embodiments, the spall releasing plane 15 and the lower and upper portions of the Group III nitride material layer 14 have a same crystal structure, i.e., they are in epitaxial alignment with each other.

The spall releasing plane 15 can be formed by first growing a lower portion of the Group III nitride material layer 14 on the substrate 10. The growing of the lower portion 14L of the Group III nitride material layer 14 may be performed utilizing the MOCVD process mentioned above. Next, the spall releasing plane 15 is grown on the lower portion 14L of the Group III nitride material layer 14. After forming the spall releasing plane 15, an upper portion 14U of the Group III nitride material layer 14 is grown on the spall releasing plane 15. The growing of the upper portion 14U of the Group III nitride material layer 14 may be performed utilizing the MOCVD process mentioned above. In accordance with the present application, the first, second and third growing occurs in a same reactor chamber and without breaking vacuum between each growing step.

In some embodiments, the second growing of the spall releasing plane 15 comprises changing a composition of a Group III nitride material precursor from that used in growing the lower and upper portions of the Group III nitride material layer 14. For example, a gallium precursor and a nitride precursor may be used in forming the lower and upper portions of the Group III nitride material layer 14, while a gallium precursor, an aluminum precursor, a nitride precursor and at least one impurity atom can be used in forming the spall releasing plane 15.

In some embodiments, the second growing of the spall releasing plane 15 comprises introducing an impurity into the gas flow and then removing the impurity from the gas flow after a predetermined period of time. In another embodiment, and as mentioned above, the impurity used in providing the spall releasing plane 15 can be introduced in the absence of any Group III nitride material precursor.

In another embodiment, the second growing of the spall releasing plane 15 comprises changing a deposition temperature from that used in forming the lower and upper portions of the Group III nitride material layer 14. For example, the lower and upper portions of the Group III nitride material layer may be formed at a deposition temperature from 850° C. to 1250° C., while the spall releasing plane 15 may be formed at a deposition temperature from 450° to 600° C.

In another embodiment, the second growing of the spall releasing plane 15 comprises changing the carrier gas as compared to that used in forming the lower and upper portions of the Group III nitride material layer 14. For example, the lower and upper portions of the Group III nitride material layer 14 may be formed utilizing a carrier gas of helium, while the spall releasing plane 15 may be formed utilizing a carrier gas of hydrogen, nitrogen or argon.

The multilayered stack of FIG. 1 also includes a semiconductor device layer 16 located on the Group III nitride material layer 14. The semiconductor device layer 16 can include one or more devices including, but not limited to, transistors, capacitors, diodes, BiCMOS, resistors, etc. can be processed on and/or within the Group III nitride material layer 14 utilizing techniques well known to those skilled in the art. In one embodiment, the semiconductor device layer 16 includes a plurality of epitaxially grown semiconductor materials formed atop the Group III nitride material layer 14. In one embodiment, the semiconductor device layer 16 includes LEDs. For example, the semiconductor device layer 16 may include various epitaxially grown Group III nitride materials.

Figure 2:
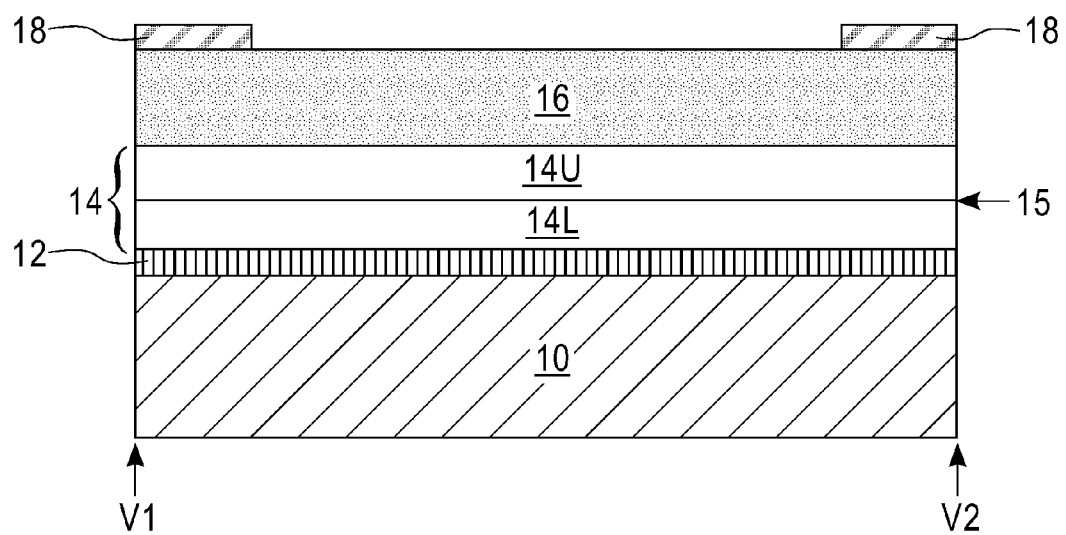
FIG. 2 is a cross sectional view of the multilayered stack of FIG. 1 after forming an edge exclusion material on the uppermost surface of the multilayered stack in accordance with the present application.

Referring to FIG. 2, there is illustrated the multilayered stack of FIG. 1 after forming an edge exclusion material 18 on the uppermost surface and at the vertical edges V1, V2 of the multilayered stack. As shown, the edge exclusion material 18 has one edge that is vertical coincident with vertical edge V1,V2 of the multilayered stack, while another edge of the edge exclusion material 18 is located inward from edge V1,V2 and on the uppermost surface of the multilayered stack. The term "edge exclusion region" is used throughout the present application to denote an area atop the multilayered stack in which a subsequently formed stressor layer is either not present or if, present, the stressor layer does not significantly adhere to the uppermost surface of the multilayered stack. The formation of the edge exclusion material 18 minimizes edge-related substrate breakage during spalling. In some embodiments, the edge exclusion material is omitted.

In one embodiment of the present application, the edge exclusion material 18 can be an adhesion demoter. By "adhesion demoter" it is meant any material that reduces the ability of a subsequently formed optional metal-containing adhesion layer or stressor layer to adhere, i.e., stick, to the uppermost surface of the multilayered stack. The adhesion demoters that can be employed in the present application as the edge exclusion material 18 include, but are not limited to, photoresist materials, polymers, hydrocarbon materials, inks, powders, pastes or non-adherent metals. In one embodiment, the adhesion demoter that can be employed in the present application as the edge exclusion material 18 is an ink.

The photoresist materials that can be employed as the adhesion demoter include any well known positive-tone materials and/or negative-tone materials. The polymers that can be employed as the adhesion demoter include, but are not limited to, natural polymers such as rubbers, shellac, cellulose, synthetic polymers such as nylon, polyethylene and polypropylene, deposited or applied in the form of tape or film. The hydrocarbon materials that can be employed as the adhesion demoter include, but are not limited to, saturated hydrocarbons (i.e., alkanes), unsaturated hydrocarbons (i.e., alkenes or alkynes), cycloalkanes, and aromatic hydrocarbons (i.e., arenes). Inks that can be employed as the adhesion demoter include, but are not limited to, alcohol or water-based inks commonly found in commercial permanent markers or inks used in bubble-jet printing technology. Non-adherent metals that can be employed as the adhesion demoter include, but are not limited to, Au, Ag, solders or low-melting point alloys. Pastes that can be employed as the adhesion demoter include, but are not limited to, metal based pastes, partially-cured epoxies, vacuum grease or similar materials.

The adhesion demoters that can be employed in the present application as the edge exclusion material 18 can be formed onto the uppermost surface of the multilayered stack near edges V1, V2 utilizing techniques that are well known in the art. For example, the adhesion demoters that can be employed in the present application as the edge exclusion material 18 can be formed by chemical vapor deposition, plasma enhanced chemical vapor deposition, atomic layer deposition, spin-coating, brushing, spray coating, screen-printing, bubble-jet printing, or fabric-tip application. In some embodiments in which inks are employed as the adhesion demoters, the ink can be applied from a pen or marker containing the same. In one embodiment, the edge exclusion material 18 has a width, which is determined from one sidewall edge to another sidewall edge, of from 0.01 mm to 10 mm. In another embodiment, the edge exclusion material 18 has a width of from 0.1 mm to 5 mm. It is observed that the portion of the multilayered stack that is located directly beneath the edge exclusion material 18 defines an edge exclusion region whose presence minimizes the edge related breakage during a subsequent spalling process.

Figure 3:
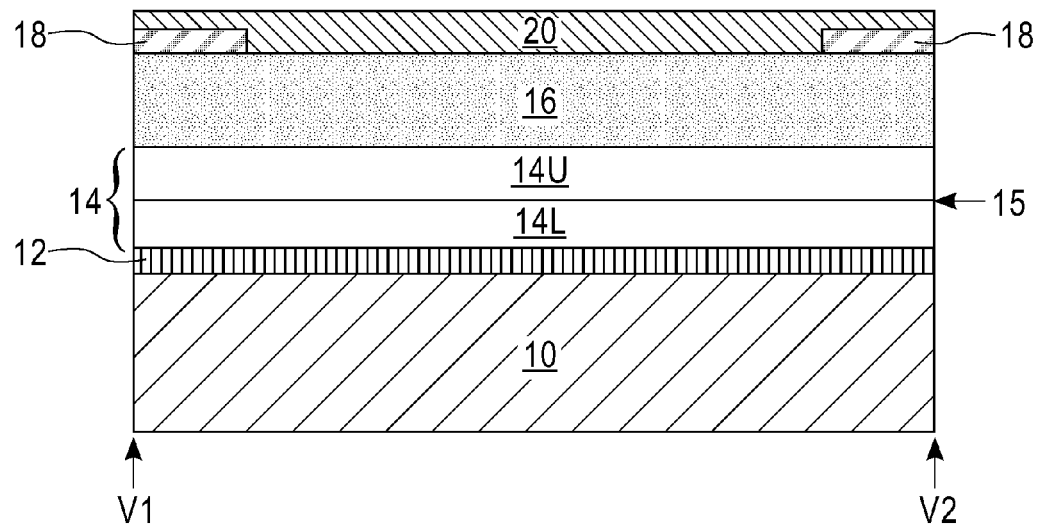
FIG. 3 is a cross sectional view of the structure of FIG. 2 after forming an optional metal-containing adhesion layer on an exposed portion of the uppermost surface of the multilayered stack not including the edge exclusion material in accordance with the present application.

Referring now to FIG. 3, there is illustrated the structure of FIG. 2 after forming an optional metal-containing adhesion layer 20 on an exposed portion of the uppermost surface of the multilayered stack not including the edge exclusion material 18. If the edge exclusion material 18 is not used, the optional metal-containing adhesion layer can be formed on the entirety of the uppermost surface of the multilayered stack shown in FIG. 1.

The optional metal-containing adhesion layer 20 is employed in embodiments in which the stressor layer to be subsequently formed has poor adhesion to uppermost surface of the multilayered stack. Typically, the metal-containing adhesion layer 20 is employed when a stressor layer comprised of a metal is employed. In some embodiments, an optional plating seed layer (not shown) can be formed directly atop the uppermost surface of the multilayered stack. The optional plating seed layer can be used together with the metal-containing adhesion layer 20 or in lieu thereof. When the optional plating seed layer is employed in conjunction with the edge exclusion material 18, the edge exclusion material 18 is applied to the uppermost surface of the multilayered stack prior to deposition of the plating seed layer.

The optional metal-containing adhesion layer 20 that can be employed in the present application includes any metal adhesion material such as, but not limited to, Ti/W, Ti, Cr, Ni or any combination thereof. The optional metal-containing adhesion layer 20 may comprise a single layer or it may include a multilayered structure comprising at least two layers of different metal adhesion materials.

When present, the optional metal-containing adhesion layer 20 can be formed at a temperature from 15° C. to 40° C., i.e., 288K to 313K, or above. In one embodiment, the optional metal-containing adhesion layer 20 can be formed at a temperature which is from 20° C. (293K) to 180° C. (353K). In another embodiment, the optional metal-containing adhesion layer 20 can be formed at a temperature which is from 20° C. (293K) to 60° C. (333K).

The metal-containing adhesion layer 20, which may be optionally employed, can be formed utilizing deposition techniques that are well known to those skilled in the art. For example, the optional metal-containing adhesion layer 20 can be formed by sputtering, chemical vapor deposition, plasma enhanced chemical vapor deposition, chemical solution deposition, physical vapor deposition, or plating. When sputter deposition is employed, the sputter deposition process may further include an in-situ sputter clean process before the deposition.

When employed, the optional metal-containing adhesion layer 20 typically has a thickness from 5 nm to 300 nm, with a thickness from 100 nm to 150 nm being more typical. Other thicknesses for the optional metal-containing adhesion layer 20 that are below and/or above the aforementioned thickness ranges can also be employed in the present application.

The optional plating seed layer (not shown) is typically employed in embodiments in which the stressor layer to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Ti/Ni, Ti/Ag, Ti/Au, Cr/Ni, Cr/Ag, Cr/Au, Al(bottom)/Ti/Ni (top), etc. The thickness of the optional plating seed layer may vary depending on the material or materials of the optional plating seed layer as well as the technique used in forming the same. Typically, the optional plating seed layer has a thickness from 2 nm to 1 micron. The optional plating seed layer can be formed by a conventional deposition process including, for example, chemical vapor deposition (CVD), plasma-enhanced chemical vapor deposition (PECVD), atomic layer deposition (ALD), or physical vapor deposition (PVD) techniques that may include evaporation and/or sputtering.

In accordance with the present application, the optional metal-containing adhesion layer 20 and/or the optional plating seed layer is (are) formed at a temperature which does not effectuate spontaneous spalling to occur within the multilayered stack.

Figure 4:
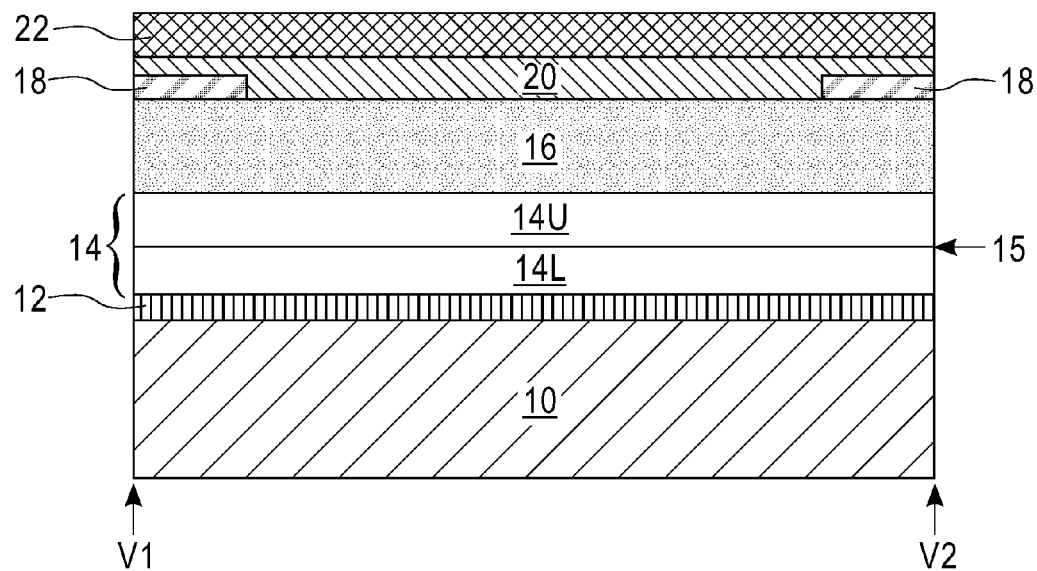
FIG. 4 is a cross sectional view of the structure of FIG. 3 after forming a stressor layer on an upper surface of the optional metal-containing adhesion layer in accordance with the present application.

Referring now to FIG. 4, there is illustrated the structure of FIG. 3 after forming a stressor layer 22 on an upper surface of the optional metal-containing adhesion layer 20. In some embodiments in which the optional metal-containing adhesion layer 20 and the edge exclusion material 18 are not present, the stressor layer 22 can be formed directly on the uppermost surface of the multilayered stack; this particular embodiment is not shown in the drawings, but can readily be deduced from the drawings illustrated in the present application. In other embodiments in which an optional plating seed layer is employed, the stressor layer 22 can be formed directly on the upper surface of the optional plating seed layer; this particular embodiment is also not shown in the drawings, but can readily be deduced from the drawings illustrated in the present application.

The stressor layer 22 that can be employed in the present application includes any material that is under tensile stress on multilayered stack (i.e., elements 10, 12, 14 and 16) after deposition. The stressor layer 22 can also be referred to a stress inducing layer. In accordance with the present application, the stressor layer 22 has a critical thickness and a stress value that cause spalling mode fracture to occur at the spall releasing plane 15 that is embedded within the Group III nitride material layer 14. In particular, the stressor layer 22 has a critical thickness in which spalling is initiated below the uppermost surface of Group III nitride material layer 14 and at the spall releasing plane 15. By 'critical', it is meant that for a given stressor material and Group III nitride material combination, a thickness value and a stressor value for the stressor layer is chosen that render spalling mode fracture possible (can produce a $K_I$ value greater than the $K_{IC}$ of the Group III nitride material). The stress value can be adjusted by tuning the deposition conditions of the stressor layer 22. For example, in the case of sputter deposition of stressor layer 22, the gas pressure can be used to tune the stress value as described in Thorton and Hoffman, *J. Vac. Sci. Technol.*, 14 (1977) p. 164.

The thickness of the stressor layer 22 is chosen to provide the desired fracture depth at the spall releasing plane 15 embedded within the Group III nitride. For example, if the stressor layer 22 is chosen to be Ni, then fracture will occur at a depth below the stressor layer 22 roughly 2 to 3 times the Ni thickness. The stress value for the stressor layer 22 is then chosen to satisfy the critical condition for spalling mode fracture. This can be estimated by inverting the empirical equation given by $t^* = [(2.5 \times 10^6)(K_{IC}^{3/2})]/\sigma^2$, where $t^*$ is the critical stressor layer thickness (in microns), $K_{IC}$ is the fracture toughness (in units of MPa·m$^{1/2}$) of the Group III nitride material layer 14 and a is the stress value of the stressor layer (in MPa or megapascals). The above expression is a guide, in practice, spalling can occur at stress or thickness values up to 20% less than that predicted by the above expression.

Illustrative examples of such materials that are under tensile stress when applied atop the multilayered stack and thus can be employed as the stressor layer 22 include, but are not limited to, a metal, a polymer, such as a spall inducing tape layer, or any combination thereof. The stressor layer 22 may comprise a single stressor layer, or a multilayered stressor structure including at least two layers of different stressor material can be employed.

In one embodiment, the stressor layer 22 is a metal, and the metal is formed on an upper surface of the optional metal-containing adhesion layer 20. In another embodiment, the stressor layer 22 is a spall inducing tape, and the spall inducing tape is applied directly to the uppermost surface of the multilayered stack. In another embodiment, for example, the stressor layer 22 may comprise a two-part stressor layer including a lower part and an upper part. The upper part of the two-part stressor layer can be comprised of a spall inducing tape layer.

When a metal is employed as the stressor layer 22, the metal can include, for example, Ni, Cr, Fe, Mo, Ti or W.

Alloys of these metals can also be employed. In one embodiment, the stressor layer 22 includes at least one layer consisting of Ni.

When a polymer is employed as the stressor layer 22, the polymer is a large macromolecule composed of repeating structural units. These subunits are typically connected by covalent chemical bonds. Illustrative examples of polymers that can be employed as the stressor layer 22 include, but are not limited to, polyimides polyesters, polyolefins, polyacrylates, polyurethane, polyvinyl acetate, and polyvinyl chloride.

When a spall inducing non-metallic layer (i.e. polymeric materials such as a tape) is employed as the stressor layer 22, the spall inducing layer includes any pressure sensitive tape that is flexible, soft, and stress free at a first temperature used to form the tape, yet strong, ductile and tensile at a second temperature used during removal, i.e., spalling, of a portion the Group III nitride material layer 14. By "pressure sensitive tape," it is meant an adhesive tape that will stick with application of pressure, without the need for solvent, heat, or water for activation. Tensile stress in the tape at the second temperature is primarily due to thermal expansion mismatch between the materials of the multilayered stack (with a lower thermal coefficient of expansion) and the tape (with a higher thermal expansion coefficient).

Typically, the pressure sensitive tape that is employed in the present application as stressor layer 22 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 22 employed in the present application is formed at room temperature (15° C.-40° C., i.e., 288K-313K). In another embodiment, when a tape layer is employed, the tape layer can be formed at a temperature from 15° C. (288K) to 60° C. (333K).

When the stressor layer 22 is a metal or polymer, the stressor layer 22 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, or plating.

When the stressor layer 22 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present application as stressor layer 22 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the uppermost surface of the multilayered stack, wherein a lower part of the two-part stressor layer is formed at a first temperature which is at room temperature or slight above (e.g., from 15° C. (288K) to 60° C. (333K)), wherein an upper part of the two-part stressor layer comprises a spall inducing tape layer at an auxiliary temperature which is at room temperature.

If the stressor layer 22 is of a metallic nature, it typically has a thickness of from 1 μm to 50 μm, with a thickness of from 4 μm to 7 μm being more typical. Other thicknesses for the stressor layer 22 that are below and/or above the aforementioned thickness ranges can also be employed in the present application.

If the stressor layer 22 is of a polymeric nature, it typically has a thickness of from 10 μm to 200 μm, with a thickness of from 50 μm to 100 μm being more typical. Other thicknesses for the stressor layer 22 that are below and/or above the aforementioned thickness ranges can also be employed in the present application.

Figure 5:
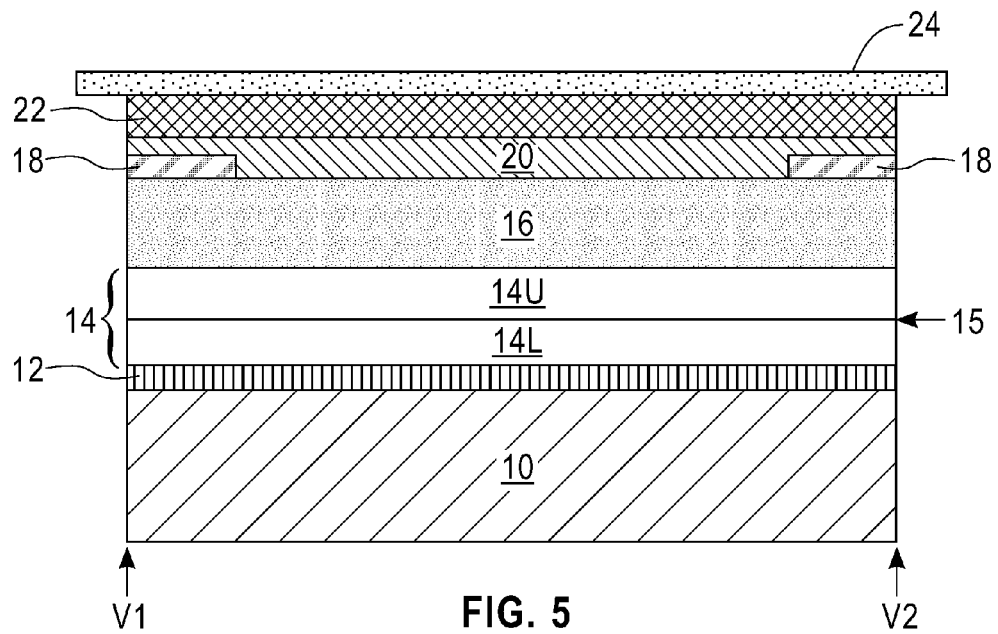
FIG. 5 is a cross sectional view of the structure shown in FIG. 4 after forming a handle substrate atop the stressor layer in accordance with the present application.

Referring to FIG. 5, there is illustrated the structure of FIG. 4 after forming a handle substrate 24 atop the stressor layer 22. The handle substrate 24 employed in the present application comprises any flexible material which has a minimum radius of curvature of less than 30 cm. Illustrative examples of flexible materials that can be employed as the handle substrate 24 include a metal foil or a polyimide foil. In some embodiments, a tape, as described above, can be used as the handle substrate 24.

The handle substrate 24 can be used to provide better fracture control and more versatility in handling the spalled portion of the Group III nitride material layer 14. Moreover, the handle substrate 24 can be used to guide the crack propagation at the spall releasing plane 15 that is embedded within the Group III nitride material layer 14 during the spalling process of the present application. The handle substrate 24 of the present application is typically, but not necessarily, formed at a first temperature which is at room temperature (15° C. (288K)-40° C. (313K)).

The handle substrate 24 can be formed utilizing deposition techniques that are well known to those skilled in the art including, for example, mechanical pressure, dip coating, spin-coating, brush coating, sputtering, chemical vapor deposition, plasma enhanced chemical vapor deposition, chemical solution deposition, physical vapor deposition, and plating.

The handle substrate 24 typically has a thickness of from 5 μm to 500 μm, with a thickness of from 10 μm to 150 μm being more typical. Other thicknesses for the handle substrate 24 that are below and/or above the aforementioned thickness ranges can also be employed in the present application.

Figure 6:
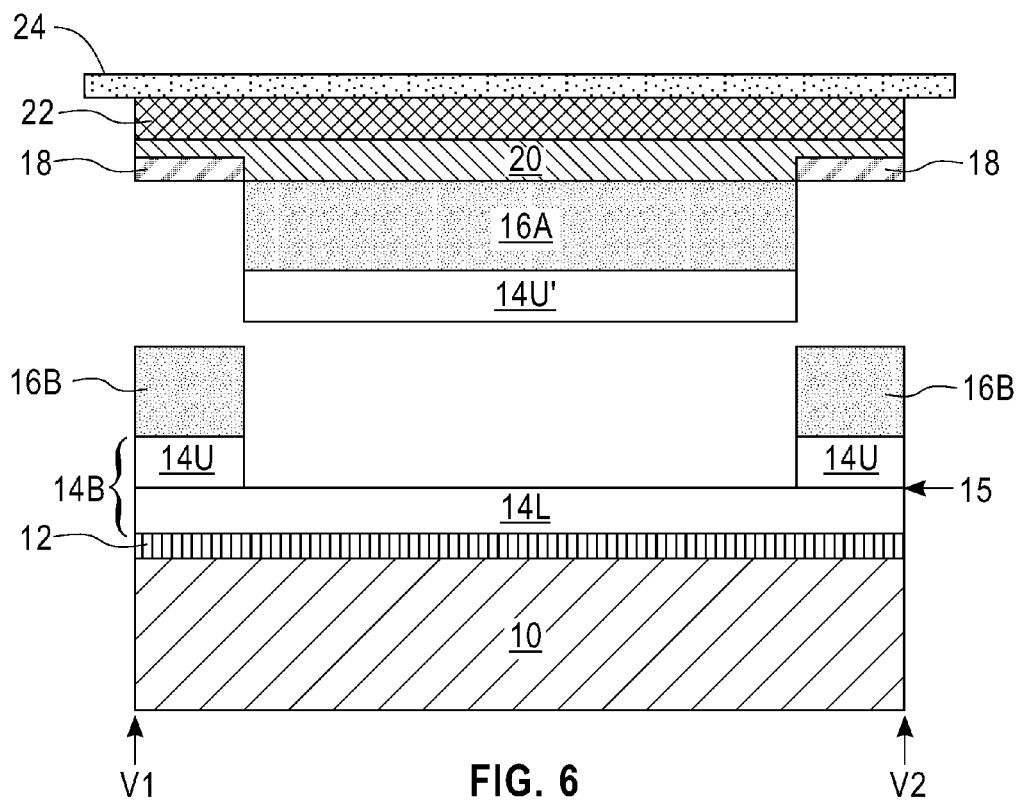
FIG. 6 is a cross sectional view of the structure shown in FIG. 5 after removing a portion of the Group III nitride material layer above the spall releasing plane by spalling in accordance with the present application.

Referring to FIG. 6, there is illustrated the structure of FIG. 5 after removing a section of the upper portion 14U of the Group III nitride material layer 14 that is located above the spall releasing plane 15 by spalling. In one embodiment of the present application, the spalling process includes pulling or peeling the handle substrate 24 to remove a spalled structure that includes at least the stressor layer 22, the semiconductor device layer 16 and a section of the upper portion (i.e., 14U') of the Group III nitride material layer 14. The section of the upper portion of the Group III nitride material layer 14 that is removed by spalling from the original Group III nitride material layer 14 may be referred to herein as a spalled Group III nitride material layer 14U'. The remaining portion of the original Group III nitride material layer 14 may be referred to herein as reuseable Group III nitride material layer 14B which includes the entirety of the lower portion 14L of the Group III nitride material layer and remaining upper portions 14U.

It is noted that if an edge exclusion material 18 is present, portions of the semiconductor device layer 16 and the Group III nitride material layer 14 that are located directly beneath the edge exclusion material 18 are not removed. The spalled portion of the semiconductor device layer 16 is represented as element 16A in the drawings, while the portion of the semiconductor device layer that remains attached to the original Group III nitride material layer 14 is represented as element 16B in the drawings.

The spalling process includes crack formation and propagation at the spall releasing plane 15 within the Group III nitride material layer 14. The spalling process is initiated at substantially room temperature (i.e., 15° C. to 40° C.). In other embodiments, spalling can be performed at a temperature from 100° C. and below. In some embodiments of the present application, spalling can be initiated by lowering the temperature at a fixed continuous rate. By "fixed continuous rate" it is mean, for example, 20° C. per second utilizing an electronically controlled cooling table or chamber.

After spalling, handle substrate 24, stressor layer 22, and, if present the optional plating seed layer, the optional metal-containing adhesion layer 20, and the edge exclusion material 18 can be removed from the spalled structure leaving only a material stack of the semiconductor device layer 16 and the spalled Group III nitride material layer 14U'. Such a structure is shown, for example, in FIG. 7.

The handle substrate 24, the stressor layer 22, the optional plating seed layer and the optional metal-containing adhesion layer portion 20 can be removed at this point of the present application utilizing conventional techniques well known to those skilled in the art. For example, and in one embodiment, aqua regia ($HNO_3/HCl$) can be used for removing the handle substrate 24, the stressor layer 22, the optional plating seed layer, and the optional metal-containing adhesion layer 16. In another example, UV or heat treatment is used to remove the handle substrate 24 followed by a chemical etch to remove the stressor layer 22, followed by a different chemical etch to remove the optional plating seed layer, and optional metal-containing adhesion layer 16. The edge exclusion material 18 can be removed utilizing an organic solvent such, for example, as acetone.

The thickness of the spalled Group IIII material layer 14U' that is removed from the original Group III nitride material layer 14 varies depending on the material of the stressor layer 22, the material of the Group III nitride material layer 14, and the location of the spall releasing plane 15. In one embodiment, the spalled material layer 14U' that is removed from the original Group III nitride material layer 14 has a thickness of less than 100 microns. In another embodiment, the spalled material layer 14U' that is removed has a thickness of less than 50 microns.

Figure 8:
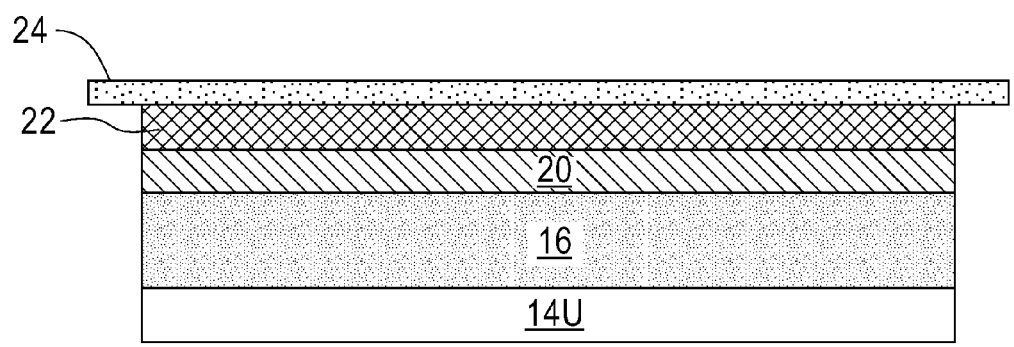
FIG. 8 is a cross sectional view of a structure shown in FIG. 5 without the edge exclusion material and after removing a portion of the Group III nitride material above the spall releasing plane by spalling in accordance with the present application.
Figure 8:
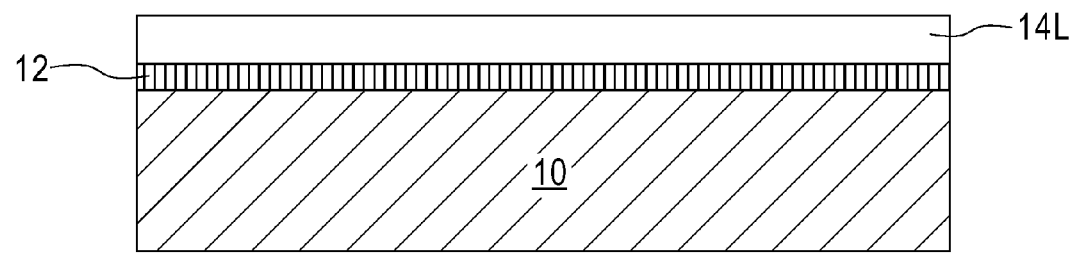

Referring now to FIG. 8, there is illustrated a structure such as shown in FIG. 5 without the edge exclusion material 18 and after removing a portion of the Group III nitride material above the spall releasing plane 15 by spalling in accordance with the present application. Note that in this instance the entirety of the semiconductor device layer 16 and the entirety of the upper portion 14U of Group III nitride material layer 14 are removed.

Figure 9:
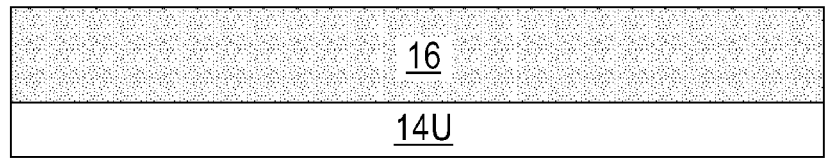
FIG. 9 is a cross sectional view of the structure shown in FIG. 8 after removing the handle substrate, the stressor layer, and the optional metal-containing adhesion layer from atop a spalled structure that includes the semiconductor device layer and a spalled portion of a Group III nitride material in accordance with the present application.

Referring now to FIG. 9, there is illustrated the structure shown in FIG. 8 after removing the handle substrate 24, the stressor layer 22, and the optional metal-containing adhesion layer 20 from atop a spalled structure that includes the semiconductor device layer 16 and a spalled portion of the Group III nitride material (i.e., the entirety of the upper portion 14U of the Group III nitride material layer 14) in accordance with the present application.

Figure 7:
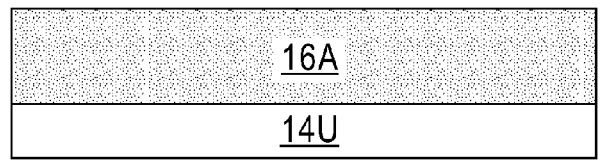
FIG. 7 is a cross sectional view of the structure shown in FIG. 6 after removing the handle substrate, the stressor layer, the optional metal-containing adhesion layer, and the edge exclusion material from atop a spalled structure that includes the semiconductor device layer and a spalled portion of a Group III nitride material in accordance with the present application.

In some embodiments of the present application, the spalled structures shown in either FIG. 7 or FIG. 9 can be transferred to another substrate. The transferring may be performed utilizing a conventional bonding process as is well known to those skilled in the art. The another substrate may be flexible, or non-flexible. In some embodiments, the another substrate may be comprised of a semiconductor material. In other embodiments, the another substrate may be comprised of a dielectric material. After transferring, a spalled Group III nitride/another substrate interface may form.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method for removing a portion of a Group III nitride material from a Group III nitride layer, said method comprising:
    forming a Group III nitride material layer on a surface of a substrate, wherein said Group III nitride material layer comprises a spall releasing plane containing at least one type of impurity atom embedded within said Group III nitride material layer and wherein said forming said Group III nitride material layer comprises first growing a lower portion of said Group III nitride material layer on said substrate, second growing said spall releasing plane, and third growing an upper portion of said Group III nitride material layer on said spall releasing plane;
    forming a semiconductor device layer on said upper portion of said Group III nitride material layer
    forming a stressor layer atop an uppermost surface of said semiconductor device layer; and
    removing said upper portion of said Group III nitride material layer and said semiconductor device layer by spalling to provide a spalled structure comprising said stressor layer, said semiconductor device layer and said upper portion of said Group III nitride material layer.

2. The method of claim 1, further comprising forming an edge exclusion material on said uppermost surface and at each vertical edge of said semiconductor device layer prior to forming said stressor layer.

3. The method of claim 2, wherein said edge exclusion material comprises a photoresist material, a polymer, a hydrocarbon material, an ink, a metal, or a paste.

4. The method of claim 1, further comprising forming a metal-containing adhesion layer between said stressor layer and said semiconductor device layer.

5. The method of claim 1, wherein said stressor layer comprises a metal, a polymer, a spalling inducing tape or any combination thereof.

6. The method of claim 1, further comprising forming a handle substrate on an exposed surface of said stressor layer prior to spalling.

7. The method of claim 6, wherein said spalling comprises pulling or peeling said handle substrate.

8. The method of claim 1, wherein said spalling is performed at room temperature.

9. The method of claim 1, further comprising removing at least said stressor layer from said spalled structure.

10. The method of claim 1, wherein said substrate comprises sapphire.

11. The method of claim 1, wherein said semiconductor device layer comprises a multilayered stack of epitaxially grown Group III nitrides.

12. The method of claim 11, wherein forming said Group III nitride material layer comprises a metalorganic chemical vapor deposition process.

13. The method of claim 1, wherein said at least one type of impurity atom of spall releasing plane is selected from silicon, magnesium, beryllium, calcium and carbon.

14. The method of claim 1, wherein said first growing, said second growing and third growing occur in a same reactor chamber without breaking vacuum between each growing step.

15. The method of claim 1, wherein said lower portion of said Group III nitride material layer, said spall releasing plane, and said upper portion of said Group III nitride material layer have a same crystal structure.

16. The method of claim 1, wherein said spall releasing plane has a lower fracture toughness than a fracture toughness of said lower and upper portions.

17. The method of claim 1, wherein said spalling releasing plane comprises a Group III nitride doped with silicon, magnesium, beryllium, calcium or carbon.

18. The method of claim 1, wherein said lower portion of said Group III nitride material layer comprises a same Group III nitride material layer as said upper portion of said Group III nitride material layer.

19. The method of claim 1, wherein said lower portion of said Group III nitride material layer comprises a different Group III nitride material layer as said upper portion of said Group III nitride material layer.

* * * * *